United States Patent
Devendorf et al.

(10) Patent No.: US 6,580,383 B1
(45) Date of Patent: Jun. 17, 2003

(54) HIGH RESOLUTION ADC BASED ON AN OVERSAMPLED SUBRANGING ADC

(75) Inventors: Don C. Devendorf, Carlsbad, CA (US); Benjamin Felder, Saugus, CA (US); Lloyd F. Linder, Agoura Hills, CA (US)

(73) Assignee: Telasic Communications, Inc., El Sequndo, CA (US)

( * ) Notice: Subject to any disclaimer, the term of this patent is extended or adjusted under 35 U.S.C. 154(b) by 0 days.

(21) Appl. No.: 09/703,646

(22) Filed: Nov. 1, 2000

(51) Int. Cl.⁷ .............................................. H03M 3/00
(52) U.S. Cl. ..................... 341/143; 341/118; 341/120; 341/155; 327/116
(58) Field of Search ............................... 341/110–172; 327/116

(56) References Cited

U.S. PATENT DOCUMENTS

| | | | | |
|---|---|---|---|---|
| 4,833,474 A | * | 5/1989 | Nagai et al. ................. | 341/166 |
| 5,113,189 A | * | 5/1992 | Messer et al. ............... | 341/143 |
| 5,387,913 A | * | 2/1995 | Park et al. ................... | 341/143 |
| 5,625,359 A | * | 4/1997 | Wilson et al. ............... | 341/143 |
| 5,914,991 A | * | 6/1999 | Gigandet et al. ............ | 375/355 |
| 6,147,632 A | * | 11/2000 | Iwasaki ....................... | 341/123 |
| 6,169,506 B1 | * | 1/2001 | Oprescu et al. ............. | 341/143 |

* cited by examiner

*Primary Examiner*—Michael Tokar
*Assistant Examiner*—Linh Van Nguyen
(74) *Attorney, Agent, or Firm*—Morrison & Foerster LLP

(57) ABSTRACT

A high performance ADC apparatus. The inventive apparatus comprises a front end ADC baseline device providing a baseline bit size at a baseline data rate and a selected dynamic range at a baseline clock rate. A first circuit is enabled for translating upward, by a selected factor, a reference clock to produce the baseline clock rate. A second circuit is enabled for decimating the baseline data rate of the baseline device to a data rate reduced by the selected factor, so as to achieve an oversampling rate equal to the selected factor. A final circuit is employed for producing an output data rate less than the baseline clock rate by the selected factor with the final resolution. The method for producing this result includes providing the baseline device having a selected dynamic range at a baseline clock rate; generating the baseline clock rate by translating a reference clock upward by a selected factor; decimating the data rate of the baseline device to a slower data rate so as to achieve a selected degree of oversampling; and producing an output data rate as a sub-multiple of the baseline clock rate with the selected output resolution at the slower data rate. The architecture includes a monolithic substrate on which the baseline ADC provides a dynamic range necessary to satisfy the performance requirements of the final ADC.

6 Claims, 1 Drawing Sheet

HIGH RESOLUTION ADC BASED ON AN OVERSAMPLED SUBRANGING ADC

BACKGROUND OF THE INVENTION

1. Field of Invention

This invention relates to analog-to-digital converters. Specifically, the present invention relates to high resolution, monolithic, high speed analog-to-digital converters.

2. Description of the Related Art

Analog to digital converters (ADCs) are well known in the art. These devices convert analog signals to digital signals and are therefore used in a variety of applications. Several ADC techniques are known in the art.

A switched-capacitor ADC uses a CMOS comparator in a successive approximation system to determine each bit by examining the charge on a series of binary-weighted capacitors. In the first phase of the conversion process, the analog input is sampled by closing switches simultaneously charge a plurality of capacitors in parallel interconnection to the input analog voltage. In the next phase of the conversion process, all switches are opened and the comparator begins identifying bits by identifying the charge on each capacitor relative to the reference volts. In the switching sequence, all capacitors are examined separately until all bits are identified, and then the charge-convert sequence is repeated. In the first step of the conversion phase, the comparator looks at the first capacitor having a binary weight of 128. One pole of the capacitor is switched to the reference voltage, and the equivalent poles of all the other capacitors on the ladder are switched to ground. If the voltage at the summing node is greater than the trip point of the comparator, approximately ½ the reference voltage, a bit is placed in the output register, and the 128 weight capacitor is switched to ground. If the voltage at the summing node is less than the trip point of the comparator, this 128 weight capacitor remains connected to the reference input through the remainder of the capacitor sampling process. The process is repeated for the 64-weight capacitor, the 32-weight capacitor and so forth until all bits are tested. With each step of the capacitor sampling process, the initial charge is redistributed among the capacitors. The conversion process is successive approximation, but relies on charge shifting rather than a successive approximation register and a reference digital to analog converter (D/A or DAC) to count and weigh the bits from the MSB to the LSB.

In a tracking ADC an analog input is fed into a span resistor of a DAC. The analog input voltage range is selectable in the same way as the output voltage range of the DAC. The net current flow through a ladder termination resistance produces an error voltage at the DAC output. This error voltage is compared with ½ LSB by a comparator. When the error voltage is within +/−½ LSB range, the output of + to − common comparators are both low, which stops the counter and gives a data ready signal to indicate that the digital output is correct. If the error exceeds the +/−LSB range, the counter is enabled and driven in an up or down direction depending on the polarity of the error voltage. The digital output changes state only when there is a significant change in the analog input. When monitoring a slowly varying input, it is necessary to read the digital output only after a change has taken place. The data ready signal could be used to trigger a flip-flop to indicate the condition and reset it after readout. The main disadvantage of the tracking ADC is the time required to initially acquire a signal; for a 12 bit ADC, it could be up to 4096 clock periods. The input signal usually must be filtered so that its rate of change does not exceed the tracking range of the ADC, i.e., 1 LSB per clock period.

An A/D conversion technique which combines some of the speed advantages of flash conversion with the circuitry savings of successive approximation is termed "half-flash" or subranging ADC. In an 8 bit, half-flash converter, two 4 bit flash A/D sections are combined. The upper flash A/D compares the input signal to the reference and generates the upper 4 data bits. This data goes to an internal DAC, whose output is subtracted from the analog input. Then, the difference is measured by the second flash A/D, which provides the lower 4 data bits.

Of particular relevance is a technical paper by Todd L. Brooks, et al of Analog Devices, Inc., Wilmington, Mass., and presented at the IEEE International Solid-State Circuits Conference in 1997 and also a U.S. Pat. No. 5,936,562 to Brooks, et al issued on Aug. 10, 1999, the teachings of which are incorporated herein by reference. Brooks, et al describe a 16 bit sigma-delta (SD) pipeline ADC with 2.5 MHz output data rate. This device is fabricated in 0.6 um CMOS and addresses the need for a wide dynamic range ADC with bandwidth in excess of 1 MHz in multi-tone communication. This ADC combines the advantages of SD and pipeline ADC techniques to provide wide dynamic range with a low-oversampling ratio. The device operates at a 20 MHz clock rate, 2.5 MHz output rate (8× oversampling), and provides 89 dB SNR over a 1.23 MHz input bandwidth. This is a two-pass subranging architecture, where the fine encoder is a subranging 12 bit ADC that is oversampled by 8×, and the coarse encoder is a 5 bit SD. The process used is CMOS and the DAC is a switched capacitor circuit with randomization to improve the integral nonlinearity of the DAC.

However, this approach has many problems. The differential nonlinearity (DNL) of this DAC is limited by the achievable capacitor matching of the CMOS process. Randomization helps the spur free dynamic range, see FIGS. 5 and 6 of the reference, but only at the expense of signal-to-noise ratio (SNR) degradation. Also, as is well known, CMOS technology limits dynamic range.

Another disadvantage of this device is that it requires 8× higher clock rate although the bandwidth is on ⅟₁₆ of that clock rate and the clock signal must be inserted into the integrated circuit (IC).

Hence, a need remains in the art for an improved analog to digital converter design.

SUMMARY OF THE INVENTION

The need in the art is addressed by the analog to digital converter architecture of the present invention. The invention is a high performance ADC apparatus comprising a front end ADC baseline device providing a baseline bit size at a baseline data rate and having a selected dynamic range at a baseline clock rate. A second circuit decimates the baseline data rate of the baseline device to a data rate reduced by the selected factor, so as to achieve an oversampling rate equal to the selected factor. Finally, a circuit is employed for producing an output data rate less than the baseline clock rate by the selected factor with a final, high resolution.

In the illustrative implementation, the baseline clock rate is generated, by multiplying the crystal oscillator reference frequency, by a selected factor, through the use of a PLL. The reference clock frequency is the clock rate of the final, high resolution ADC.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
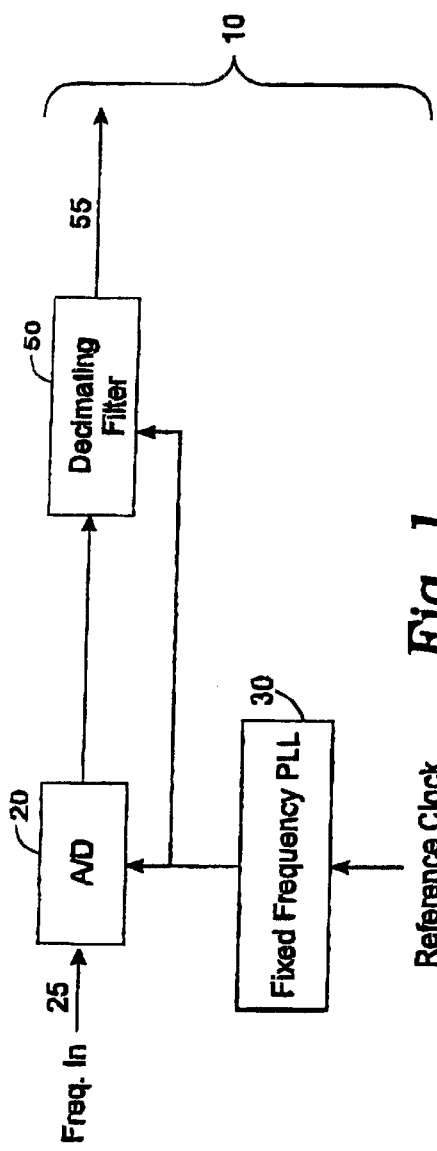
FIG. 1 is a block diagram of a first embodiment of the present invention ADC.

FIG. 1 is a block diagram of a first embodiment of the present invention ADC. As shown in FIG. 1 the inventive circuit 10 comprises a front end circuit ADC baseline device 20 for processing 14 bit data at an 80 mega-sample per second (MSPS) data rate with 14 bit dynamic range at a baseline clock rate. A phase-locked loop (PLL) circuit 30 is included for generating the baseline clock rate by multiplying the reference clock frequency by a factor of 8. A decimating filter 50 (decimator) is included to reduce the 80 MSPS data rate of the baseline device 20 to a 10 MSPS data rate so as to achieve 8 times oversampling. This oversampling allows enhancement of the baseline ADC SNR to achieve the SNR of the final ADC. Hence, the output date rate is 8 times slower than the baseline clock rate and provides output data 55 with 16-bit resolution and 10 MSPS data rate. The input signal 25 drives an input sample and hold circuit, which is further described in FIG. 2.

Figure 2:
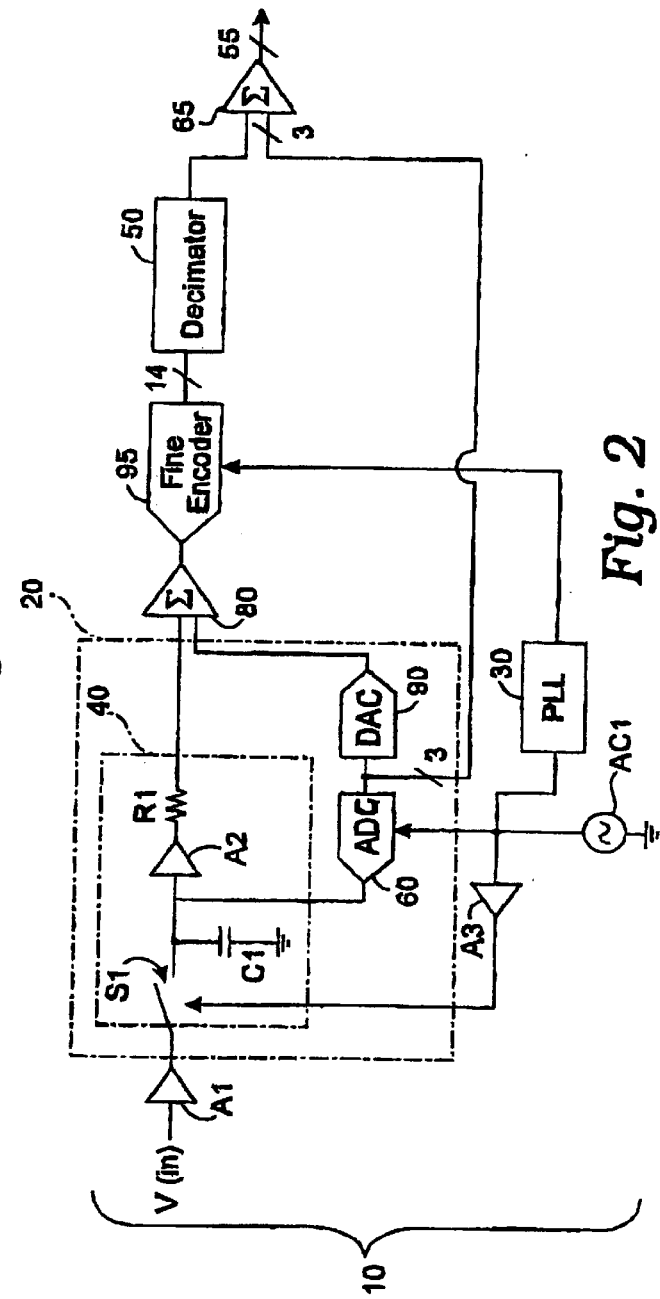
FIG. 2 is a block diagram of a second embodiment of the present invention ADC.

FIG. 2 is a block diagram of a second embodiment of the present invention ADC. As shown, a front end 20 provides a band limited sample and hold circuit 40 and runs at a clock rate equal to the final clock rate. The front end 20 provides an input buffer unity amplifier Al feeding the input signal V(in) to the sample and hold circuit 40 comprising a sampling switch S1, as shown, operated at the rate of crystal oscillator AC1, capacitor C1, and resistor R1. R1 is a critical resistor for generating a residue of the input signal. The 3-bit, ADC 60 is driven by crystal oscillator AC1. Summing circuit element (sum node) 80 provides summing of the DAC 90 output signal and the value of the sample during each cycle. The DAC is implemented in CMOS to remove thermal shot noise sources. Fine encoder 95 is preferably a three-step encoder sampling at the baseline sample rate as driven by the PLL circuit 30 at 80 MHz. At the output this signal as decimated through decimating filter 50 is summed with the ADC 60 front-end data using a summer 65.

The slower switching speed of CMOS does not degrade overall performance of the invention. PLL jitter does not degrade signal-to-noise (SNR) performance since the input sample and hold circuit 40 uses the final ADC clock rate rather than a multiplied version thereof, which might introduce phase and thermal noise.

In the best mode, the system is implemented in complementary bipolar CMOS (CBICMOS) as this approach appears to provide the highest dynamic range, widest bandwidth and superior SNR. In the illustrative embodiment, laser trimable, thin film, tantalum nitride resistors R1 are used for producing improvements in differential non-linearity (DNL). This approach provides high dynamic range at low frequencies, but it also permits wide bandwidth so as to maintain acceptable performance up to video frequencies. The present invention proposes a final data rate equal to the reference clock rate and frequency multiplication is provided within the IC rather than external to it.

The present invention further teaches a method of developing the high performance ADC comprising steps of: establishing the baseline device with a selected dynamic range at a baseline clock rate; generation of the baseline clock rate by upwardly translating the reference crystal oscillator frequency by a selected factor; decimation of the data rate of the baseline device to a slower data rate so as to achieve a selected degree of oversampling; and producing an output data rate at the selected output resolution at the slower data rate. This inventive architecture includes a monolithic substrate on which a baseline ADC provides a dynamic range necessary to satisfy the performance requirements of the final ADC.

Generally, the present invention method and circuit provides a high performance X bit, Y MSPS, ADC with values of 16 and 10 respectively. The baseline input device 20 is a d bit, Y*c MSPS data rate ADC with values of 14 and 80 respectively wherein the device provides d bit dynamic range, typically 14 bit, at a baseline clock rate. The baseline clock rate is generated by upwardly translating the crystal oscillator reference frequency by the factor of c using the PLL circuit 30. A decimating filter 50 reduces the Y*10, typically 80, MSPS data rate of the baseline device to the Y MSPS data rate so as to achieve c, typically 8 times oversampling; and the output data rate is c times slower than the baseline clock rate with X bit output resolution at Y MSPS data rate. The typical values for X and Y are 16 and 10 respectively, as shown above.

The high performance ADC is oversampled; in this case by 8 times, to achieve a SNR improvement of $10 \log(2)^3$, e.g., 9 dB. In order to generate the 8× oversampling clock signal, and permit it to be transparent to the user, a frequency multiplying phase lock loop (PLL) is used to translate the input clock signal by a factor of 8 to provide the clock signal for the ADC. This signal drives the input sample and hold circuit so that the effect of PLL jitter on the SNR of the ADC must be minimized. Since the ADC runs at a high clock rate, a bipolar DAC must be used. It is well known in the art that a bipolar DAC has alpha errors and base shot noise which degrade the ADC SNR and DNL over typical operating temperature ranges. However, bipolar DAC errors are taken into account in the error budget for the baseline ADC and oversampling sufficiently reduces the thermal noise contribution. Output baseline ADC data is at 8 times the final ADC clock rate. An on-chip 8:1 digital decimating filter provides a 16 bit final data output at a 10 MHz clock rate.

A modification of FIG. 1 produces a second novelty (FIG. 2) in the present invention. In this modification, a front end is a 3 bit (ADC/DAC) running at the final clock rate. The input sample and hold circuit 40 and sum node 80 is band-limited in order to take advantage of the limited input bandwidth, that is 5 MHz=½ Nyquist. The DAC 90 is implemented in CMOS architecture essentially removing all of the thermal shot noise sources, which degrade SNR. The DAC 90 is preferably fabricated in CMOS due to its slower switching speed requirements. In addition, any jitter in the PLL 30 does not degrade the overall SNR due to the fact that the input sample and hold circuit 40 is clocked by the reference crystal oscillator frequency and not a multiplied version of it. This eliminates the possibility of introducing additional phase noise and thermal noise degradation. The encoder data is decimated and summed with the front-end data to produce the overall ADC bits at the ADC 60 clock rate.

Objectives achieved with the present invention include: use of a high resolution, high speed ADC 60 as a building block to develop a higher resolution, lower speed ADC 10, use of a PLL 30 to provide an eight fold frequency multiplication while enabling a tradeoff between PLL jitter and SNR, enablement of a multiple ADC family component based on a single design, enablement of performance at the die level commensurate with custom hybrid technology and superior to off-the-shelf-components and achievement of power levels at least one order of magnitude lower than with hybrid circuits. The present invention meets mil-standards at low cost and enables a design architecture that is adaptable with future technical evolution at state-of-the-art performance.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A high performance analog-to-digital converter comprising:
   a front end baseline device for providing a baseline bit size at a baseline data rate and a selected dynamic range at a baseline clock rate;
   first circuit means for translating the reference clock rate upward by a selected factor to generate the baseline clock rate;
   second circuit means for decimating the baseline data rate of the baseline device to a data rate reduced by the selected factor, so as to achieve an oversampling rate equal to the selected factor; and
   means for producing an output data rate less than the baseline clock rate by the selected factor with a baseline resolution.

2. A high performance X bit, Y mega-sample-per-second (MSPS) analog-to-digital converter (ADC) apparatus comprising:
   a front end comprising a d bit, Y*c MSPS data rate ADC baseline device wherein the baseline device provides X bit dynamic range at a baseline clock rate;
   a phase-locked loop for generating the baseline clock rate by translating a reference clock upward by a factor of c;
   a decimating means for decimating the Y*c MSPS data rate of the baseline device to a Y MSPS data rate so as to achieve c times oversampling; and
   a means for producing an output data rate c times slower than the baseline clock rate with X bit output resolution at a Y MSPS data rate.

3. The ADC apparatus of claim 2 wherein X=16, Y=10, d=14 and c=8.

4. A method of converting an analog signal to a digital signal including the steps of:
   a) providing a baseline device with a selected dynamic range at a baseline clock rate;
   b) translating a reference clock upward by a selected factor to generate the baseline clock rate;
   c) decimating a data rate of the baseline device to a slower data rate so as to achieve a selected degree of oversampling; and
   d) producing an output data rate as a sub-multiple of the baseline clock rate with a selected output resolution at the slower data rate.

5. A method of developing a high performance X bit, Y mega-sample-per-second (MSPS) analog-to-digital converter (ADC) comprising:
   e) providing a d bit, Y*c MSPS data rate ADC baseline device wherein the device provides d bit dynamic range at a baseline clock rate;
   f) translating a reference clock upward by a factor of c using a PLL circuit to generate the baseline clock rate;
   g) decimating the Y*c MSPS data rate of the baseline device to a Y MSPS data rate so as to achieve c times oversampling;
   h) producing an output data rate c times slower than the baseline clock rate with X bit output resolution at a Y MSPS data rate.

6. The method of claim 4 wherein X=16, Y=10, d=14 and c=8.

* * * * *